(12) United States Patent
Bobde

(10) Patent No.: US 10,354,990 B2
(45) Date of Patent: Jul. 16, 2019

(54) OPTIMIZED CONFIGURATIONS TO INTEGRATE STEERING DIODES IN LOW CAPACITANCE TRANSIENT VOLTAGE SUPPRESSOR (TVS)

(71) Applicant: Madhur Bobde, San Jose, CA (US)

(72) Inventor: Madhur Bobde, San Jose, CA (US)

(73) Assignee: Alpha and Omega Semiconductor incorporated, Sunnyvale, CA (US)

( * ) Notice: Subject to any disclaimer, the term of this patent is extended or adjusted under 35 U.S.C. 154(b) by 0 days.

(21) Appl. No.: 15/721,883

(22) Filed: Sep. 30, 2017

(65) Prior Publication Data

US 2018/0082993 A1 Mar. 22, 2018

Related U.S. Application Data

(60) Division of application No. 14/627,750, filed on Feb. 20, 2015, now Pat. No. 9,793,256, which is a division of application No. 13/869,869, filed on Apr. 24, 2013, now Pat. No. 8,981,425, which is a division of application No. 12/286,817, filed on Oct. 1, 2008, now Pat. No. 8,431,985, which is a continuation-in-part of application No. 11/606,602, filed on Nov. 20, 2006, now Pat. No. 7,880,223, which is a continuation of application No. 11/600,696, filed on Nov. 16, 2006, now Pat. No. 7,781,826.

(51) Int. Cl.
*H01L 27/02* (2006.01)
*H01L 29/74* (2006.01)
*H01L 29/66* (2006.01)
*H01L 21/266* (2006.01)
*H01L 29/866* (2006.01)
*H01L 29/06* (2006.01)

(52) U.S. Cl.
CPC ........ *H01L 27/0248* (2013.01); *H01L 21/266* (2013.01); *H01L 27/0255* (2013.01); *H01L 29/66106* (2013.01); *H01L 29/66371* (2013.01); *H01L 29/7412* (2013.01); *H01L 29/0649* (2013.01); *H01L 29/866* (2013.01)

(58) Field of Classification Search
None
See application file for complete search history.

(56) References Cited

U.S. PATENT DOCUMENTS 4,855,244 A * 8/1989 Hutter .................. H01L 21/761
438/203
5,156,989 A * 10/1992 Williams .............. H01L 21/761
148/DIG. 85

(Continued)

*Primary Examiner* — David E Graybill
(74) *Attorney, Agent, or Firm* — Bo-In Lin

(57) ABSTRACT

A transient-voltage suppressing (TVS) device disposed on a semiconductor substrate including a low-side steering diode, a high-side steering diode integrated with a main Zener diode for suppressing a transient voltage. The low-side steering diode and the high-side steering diode integrated with the Zener diode are disposed in the semiconductor substrate and each constituting a vertical PN junction as vertical diodes in the semiconductor substrate whereby reducing a lateral area occupied by the TVS device. In an exemplary embodiment, the high-side steering diode and the Zener diode are vertically overlapped with each other for further reducing lateral areas occupied by the TVS device.

8 Claims, 19 Drawing Sheets

(56) References Cited

U.S. PATENT DOCUMENTS

| | | | | |
|---|---|---|---|---|
| 5,317,180 A * | 5/1994 | Hutter | H01L 21/761 | 257/327 |
| 6,153,451 A * | 11/2000 | Hutter | H01L 29/66689 | 257/E21.417 |
| 6,770,918 B2 * | 8/2004 | Russ | H01L 27/0262 | 257/173 |
| 7,291,883 B2 * | 11/2007 | Kanda | H01L 29/0878 | 257/328 |
| 7,554,839 B2 * | 6/2009 | Bobde | H01L 27/0259 | 327/310 |
| 7,781,826 B2 * | 8/2010 | Mallikararjunaswamy | H01L 27/0727 | 257/328 |
| 8,338,854 B2 * | 12/2012 | Bobde | H01L 27/0259 | 257/112 |
| 8,338,915 B2 * | 12/2012 | Mallikararjunaswamy | H01L 27/0727 | 257/173 |
| 8,431,958 B2 * | 4/2013 | Bobde | H01L 27/0255 | 257/173 |
| 8,461,644 B2 * | 6/2013 | Bobde | H01L 29/407 | 257/328 |
| 8,835,977 B2 * | 9/2014 | Bobde | H01L 27/0259 | 257/107 |
| 8,896,093 B2 * | 11/2014 | Mallikarjunaswamy | H01L 27/0248 | 257/531 |
| 8,981,425 B2 * | 3/2015 | Bobde | H01L 27/0629 | 257/173 |
| 9,202,938 B2 * | 12/2015 | Bobde | H01L 29/866 | |
| 9,461,031 B1 * | 10/2016 | Bobde | H01L 29/866 | |
| 9,748,346 B2 * | 8/2017 | Mallikarjunaswamy | H01L 27/0259 | |
| 2004/0135141 A1 * | 7/2004 | Pequignot | H01L 27/0255 | 257/46 |
| 2007/0073807 A1 * | 3/2007 | Bobde | H01L 29/407 | 709/203 |
| 2007/0279824 A1 * | 12/2007 | Mallikararjunaswamy | H01L 27/0262 | 361/118 |
| 2008/0121988 A1 * | 5/2008 | Mallikararjunaswamy | H01L 27/0727 | 257/328 |
| 2009/0045457 A1 * | 2/2009 | Bobde | H01L 27/0255 | 257/328 |
| 2009/0115018 A1 * | 5/2009 | Mallikarjunaswamy | H01L 21/84 | 257/517 |
| 2010/0244090 A1 * | 9/2010 | Bobde | H01L 27/0259 | 257/112 |
| 2010/0314716 A1 * | 12/2010 | Mallikarjunaswamy | H01L 27/0727 | 257/577 |
| 2014/0167101 A1 * | 6/2014 | Bobde | H01L 27/0259 | 257/112 |
| 2014/0167218 A1 * | 6/2014 | Mallikarjunaswamy | H01L 27/0248 | 257/531 |
| 2014/0319598 A1 * | 10/2014 | Bobde | H01L 27/0629 | 257/328 |
| 2014/0363930 A1 * | 12/2014 | Bobde | H01L 29/866 | 438/133 |
| 2017/0141097 A1 * | 5/2017 | Bobde | H01L 29/43 | |
| 2017/0213815 A1 * | 7/2017 | Bobde | H01L 27/0248 | |
| 2018/0082993 A1 * | 3/2018 | Bobde | H01L 27/0248 | |

* cited by examiner

OPTIMIZED CONFIGURATIONS TO INTEGRATE STEERING DIODES IN LOW CAPACITANCE TRANSIENT VOLTAGE SUPPRESSOR (TVS)

This patent application is a Divisional Application and claims the Priority date of a co-pending application Ser. No. 14/627,750 filed on Feb. 20, 2015 and application Ser. No. 14/627,750 is a Divisional Application and claims the Priority Date of Ser. No. 13/869,869 filed by the same Applicants of this Application on Apr. 24, 20013 now issued into U.S. Pat. No. 8,981,425 on Mar. 17, 2015. application Ser. No. 13/869,869 is a Divisional Application of another application Ser. No. 12/286,817 filed on Oct. 1, 2008 and now issued into U.S. Pat. No. 8,431,958 on Apr. 30, 2013. application Ser. No. 12/286,817 is a Continuation in Part (CIP) Application of a another Patent Application with a Ser. No. 11/606,602 filed by a common Inventor of this Application on Nov. 20, 2006 and now issued into U.S. Pat. No. 7,880,223 on Feb. 1, 2011. This patent application is also a Continuation in Part (CIP) Application of another application with a Ser. No. 11/600,696 filed by a common Inventor of this application on Nov. 16, 2006 now issued into U.S. Pat. No. 7,781,826 on Aug. 24, 2010. The Disclosures made in the application Ser. Nos. 11/600,696, 11/606,602, 12/286,817 and 13/869,869 and 14/627,750 are hereby incorporated by reference.

BACKGROUND OF THE INVENTION

1. Field of the Invention

The invention relates generally to a circuit configuration and method of manufacture of a transient voltage suppressor (TVS). More particularly, this invention relates to an improved circuit configuration and method of manufacture with optimized configuration to integrate steering diodes for achieving a reduced capacitance for a transient voltage suppressor (TVS).

2. Description of the Relevant Art

The transient voltage suppressors (TVS) are commonly applied for protecting integrated circuits from damages due to the inadvertent occurrence of an over voltage imposed onto the integrated circuit. An integrated circuit is designed to operate over a normal range of voltages. However, in situations such as electrostatic discharge (ESD), electrical fast transients and lightning, an unexpected and an uncontrollable high voltage may accidentally strike onto the circuit. The TVS devices are required to serve the protection functions to circumvent the damages that are likely to occur to the integrated circuits when such over voltage conditions occur. As increasing number of devices are implemented with the integrated circuits that are vulnerable to over voltage damages, demands for TVS protection are also increased. Exemplary applications of TVS can be found in the USB power and data line protection, Digital video interface, high speed Ethernet, Notebook computers, monitors and flat panel displays.

FIG. 1A-1 shows a conventional TVS circuit implemented with diode array commonly applied for electrostatic discharge (ESD) protection of high bandwidth data buses. The TVS array includes a main Zener diode operated with two sets of steering diodes, i.e., the high side steering diode and the low side steering diode. The high side steering diode connects to the voltage source Vcc and the low side steering diode connects to the ground terminal GND with an input/output port connected between the high side and low side steering diodes. The Zener diode has a large size to function as an avalanche diode from the high voltage terminal, i.e., terminal Vcc, to the ground voltage terminal, i.e., terminal Gnd. At a time when a positive voltage strikes on one of the I/O (input/output) terminal, the high side diodes provide a forward bias and are clamped by the large Vcc-Gnd diodes, e.g., the Zener diode. The high side and low side steering diodes are designed with a small size to reduce the I/O capacitance and thereby reducing the insertion loss in high-speed lines such as fast Ethernet applications.

As an industry trend, the steering diodes are integrated with the Zener diodes. FIGS. 1A-2 and 1A-3 are two diagrams to show the integration of the steering diodes with the Zener diode. The high side and low side terminals are not visible from the outside. FIG. 1A-2 shows the integration of the high side steering diodes and low side steering diodes with a uni-directional Zener diode. To the outside, the diode unit looks like a Zener diode with very low capacitance, but internally high-side and low-side diodes are integrated with a Zener diode. The internal circuit is the same as the circuit in FIG. 1A-1. The I/O terminal is the cathode, and the GND terminal is the anode, and the VCC terminal may be internalized so that it is not noticed from the outside. FIG. 1A-3 shows the integration of the high side steering diodes and low side steering diodes with a bi-directional Zener diode circuit. However, for modern application to the electronic devices, the protection circuit implemented with such integration must be carried out without increasing the layout areas. Furthermore, there must have careful design optimization to obtain the best tradeoff between the capacitance and the forward biased voltage of the steering diodes in order to achieve a good overall voltage clamping.

FIG. 1B shows a standard circuit diagram for a conventional TVS circuit and FIG. 1B-1 is a cross sectional view for showing the actual implementation of the TVS circuit applying the CMOS processing technologies to provide the TVS circuit as integrated circuit (IC) chips. As shown in FIG. 1B-1, the device is manufactured using the CMOS processing technologies to produce diodes and NPN and PNP transistors in the semiconductor substrate with the diodes and the transistors extended along a lateral direction. The TVS circuits produced by implementing the device layout and configurations thus occupy greater areas on a substrate. It is therefore difficult to miniaturize the electronic device protected by TVS circuits as shown in FIG. 1B-1.

The inventor of this patent application disclosed a TVS circuit in a pending patent application U.S. Ser. No. 11/606, 602 with new and improved device configuration shown in FIG. 1C. This application is a Continuation-in-Part (CIP) and claims the Priority of application Ser. No. 11/606,602. The disclosures made in patent application Ser. No. 11/606, 602 are hereby incorporated by reference in this patent application. FIG. 1C shows a TVS circuit implemented with a main Zener diode formed in a P Body/N-Epi junction. The TVS circuit as shown in FIG. 1C has significant improvement by reducing the areas occupied by the device because the main Zener diode and high side diodes are now formed with a vertical configuration. This circuit uses two I/O terminals and two corresponding sets of high side and low side diodes but reversed the conductivity types of each region. The high side steering diodes is further insulated from the main Zener diode with isolation trenches thus prevent inadvertent turning on of the parasitic transistors along the lateral direction.

However, there are still further demand to reduce the areas occupied by the high side and low side steering diodes. Also, there are additional requirements to further reduce the capacitance of the steering diodes. Therefore, there are demands to provide new and improved device configurations with new structural layout and manufacturing method to achieve these goals. The new device configuration and method of manufacturing must also take into consideration a process of design optimization of the epitaxial layer with controlled doping concentration and epitaxial thickness to obtain the best tradeoff between the capacitance reduction and maintaining appropriate Zener breakdown voltage.

Therefore, a need still exists in the fields of circuit design and device manufactures for providing a new and improved circuit configuration and manufacturing method to resolve the above-discussed difficulties. Specifically, a need still exists to provide new and improved TVS circuits that can provide low cost high-density TVS circuits with reduced capacitance and good voltage clamping performance for portable electronic devices.

SUMMARY OF THE PRESENT INVENTION

It is therefore an aspect of the present invention to provide an improved TVS structural configurations implemented with high-side diode, low-side diode functioning as steering diodes. The steering diodes are integrated with a main Zener diode wherein the high-side diode, the low-side diode and the main Zener diode are all manufactured as vertical diodes in a semiconductor substrate. The high-side diode now overlaps with the main Zener diode such that the TVS now occupies significantly less area to allow for further miniaturization of the electronic devices protected by the improved TVS of this invention. The low-cost TVS circuits disclosed in this invention can achieve TVS protections with small silicon die footprint to overcome and resolve the above discussed limitations and difficulties as encountered by the conventional device configuration and manufacturing methods for producing TVS devices.

Moreover, it is another aspect of the present invention to provide an improved TVS structural configurations implemented with a pair of steering diode comprising a high side steering diode and a low side steering diode. The steering diodes are integrated with a main Zener diode wherein the high-side diode, the low-side diode and the main Zener diode are all manufactured as vertical diodes in a semiconductor substrate. The vertical diode structures require smaller chip area as compared to lateral structures because they have only one terminal on the top surface, while the lateral device structures have both the terminals on the top surface.

Another aspect of this invention is that a configuration with a single terminal on the top surface and another terminal on the bottom surface for each diode eliminates the undesirable effect of having both terminals on the top surface. The vertical diodes as now disclosed is different from the configuration that has both terminals formed on the top surface thus restricting the current flow to the lateral direction from one terminal to another near the top surface resulting in a higher series resistance. In contrast, the device of the present invention has the vertical currents transmitted between the top and the bottom terminals thus spreading the electric currents deep into the semiconductor to provide better device performance because of lower series resistance and higher maximum current density.

Another aspect of this invention is to provide an improved TVS structural configurations implemented with high-side diode, low-side diode functioning as steering diodes for integrating with a main Zener diode in a semiconductor substrate. The high-side diode of this invention is able to achieve a significantly reduced junction capacitance by lightly doping an epitaxial layer between the N-type buried layer (NBL) and a shallow P+ region, and achieving a better current spreading because of a vertical structure. The NBL is heavily doped to further enhance the electric current to spread throughout the NBL.

Another aspect of this invention is to provide an improved TVS structural configurations implemented with high-side diode, low-side diode functioning as steering diodes for integrating with a main Zener diode in a semiconductor substrate. The high-side diode, the low-side diode and the main Zener diode are all manufactured as vertical diodes such that there is no surface current. The TVS devices disclosed in this invention therefore have improved ruggedness because as discussed above that the vertical diode structures of this invention have lower series resistance (resulting in reduced power dissipation) and improved current spreading.

Another aspect of this invention is to provide an improved TVS structural configurations implemented with high-side diode, low-side diode functioning as steering diodes for integrating with a main Zener diode with a N+ doped buried layer (NBL) in a semiconductor substrate. The devices according to this configuration has improved performance because the highly doped NBL layer will suppress transistor action through the parasitic vertical PNP transistor, which is part of a parasitic thyristor (PNPN) structure formed from one I/O to another I/O. A weaker PNP transistor will ensure that the parasitic thyristor does not turn on in applications that require the Vcc and Gnd terminals to be left floating.

Another aspect of this invention is to provide an improved TVS structural configurations implemented with high-side diode, low-side diode functioning as steering diodes for integrating with a main Zener diode with a N+ doped buried layer (NBL) in a semiconductor substrate. The junction capacitance has a strong dependence on the doping concentration and decreasing the doping level by one order of magnitude reduces the junction capacitance by .about.70%.

Briefly in a preferred embodiment this invention discloses a transient-voltage suppressing (TVS) device disposed on a semiconductor substrate including a low-side steering diode, a high-side steering diode integrated with a main Zener diode for suppressing a transient voltage. The low-side steering diode and the high-side steering diode integrated with the Zener diode are disposed in the semiconductor substrate and each constituting vertical diodes in the semiconductor substrate whereby reducing a lateral area occupied by the TVS device. In an exemplary embodiment, the high-side steering diode and the Zener diode are vertically overlapped with each other for further reducing lateral areas occupied by the TVS device. In another exemplary embodiment, the Zener diode further includes a buried source-doped region below a source region. In an exemplary embodiment, the high-side steering diode further includes a lightly doped body dopant epitaxial layer disposed between a buried source dopant layer and a shallow body dopant region having a higher body dopant concentration for to achieve low junction capacitance of the high-side steering diode. In another exemplary embodiment, a high voltage electrode is disposed on a top surface of the semiconductor substrate and a low voltage electrode is disposed on a bottom surface of the semiconductor substrate for conducting a current through the low-side steering diode and the high-side steering diode integrated with the Zener diode as vertical diodes whereby surface current across a lateral direction of the semiconductor is totally eliminated. In another exemplary embodiment, the deep buried source dopant region below the source dopant region eliminating lateral latch up of turning on a parasitic bipolar transistor in the semiconductor substrate. In another exemplary embodiment, the vertical diodes of the TVS device are disposed in an epitaxial layer having a light body dopant concentration for reducing capacitances with a corresponding epitaxial layer thickness for optimizing a breakdown voltage of the high-side and low-side steering diodes. In another exemplary embodiment, the buried source dopant region having a maximum source dopant concentration achievable through an auto-doping without a diffusion process and satisfying a vertical Zener breakdown voltage requirement.

In another preferred embodiment, the present invention further discloses an electronic device formed as an integrated circuit (IC) wherein the electronic device further includes a transient voltage-suppressing (TVS) device for suppressing a transient voltage in the electronic device. The transient-voltage suppressing (TVS) device is disposed on a semiconductor substrate including a low-side steering diode, a high-side steering diode integrated with a main Zener diode for suppressing a transient voltage. The low-side steering diode and the high-side steering diode integrated with the Zener diode are disposed in the semiconductor substrate and each constituting a vertical PN junction as vertical diodes in the semiconductor substrate whereby reducing a lateral area occupied by the TVS device. In an exemplary embodiment, the high-side steering diode and the Zener diode are vertically overlapped with each other for further reducing lateral areas occupied by the TVS device. In another exemplary embodiment, the Zener diode further includes a buried source-doped region below a source region. In an exemplary embodiment, the high-side steering diode further includes a lightly doped body dopant epitaxial layer disposed between a buried source dopant layer and a shallow body dopant region having a higher body dopant concentration to achieve low junction capacitance of the high-side steering diode. In another exemplary embodiment, a high voltage electrode is disposed on a top surface of the semiconductor substrate and a low voltage electrode is disposed on a bottom surface of the semiconductor substrate for conducting a current through the low-side steering diode and the high-side steering diode integrated with the Zener diode as vertical diodes whereby surface current across a lateral direction of the semiconductor is totally eliminated. In another exemplary embodiment, the deep buried source dopant region below the source dopant region eliminating lateral latch up of turning on a parasitic bipolar transistor in the semiconductor substrate. In another exemplary embodiment, the vertical diodes of the TVS device are disposed in an epitaxial layer having a light body dopant concentration for reducing capacitances with a corresponding epitaxial layer thickness for optimizing a breakdown voltage of the high-side and low-side steering diodes. In another exemplary embodiment, the buried source dopant region having a maximum source dopant concentration achievable through an auto-doping without a diffusion process and satisfying a vertical Zener breakdown voltage requirement.

The present invention further discloses a method for manufacturing an electronic device with an integrated transient voltage suppressing (TVS) circuit. The method includes a step of applying a standard DMOS manufacturing process to manufacture vertical PN junctions to function as a low-side steering diode and a high-side steering diode integrated with a vertical Zener diode for reducing lateral areas occupied by the TVS device.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIGS. 1A-2 and 1A-3 are two diagrams to show the integration of the steering diodes with the Zener diode to achieve low capacitance in unidirectional and bi-directional blocking TVS diodes respectively.

FIG. 1B shows a standard circuit diagram for a conventional TVS circuit and FIGS. 1B-1 is a cross sectional views for showing the actual implementation of the TVS circuit applying the CMOS processing technologies to provide the TVS circuit as integrated circuit (IC) chips.

FIGS. 2 to 4 are cross sectional views for the integrated Zener diode with the high side and low side steering diodes illustrated with equivalent circuits of TVS devices implemented with N+ buried layer and isolation trenches to form vertical TVS diode arrays of this invention to reduce the areas occupied by the diode array.

DETAILED DESCRIPTION OF THE EMBODIMENTS

Figures 1, 1A:
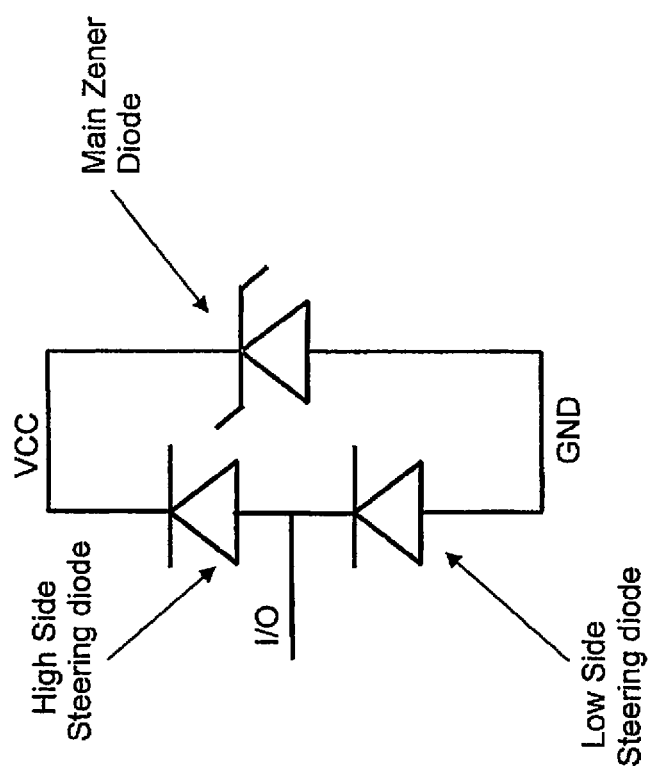
FIG. 1A-1 shows the circuit of a conventional TVS circuit implemented with diode array commonly applied for electrostatic discharge (ESD) protection.
Figures 1, 1A, 2:
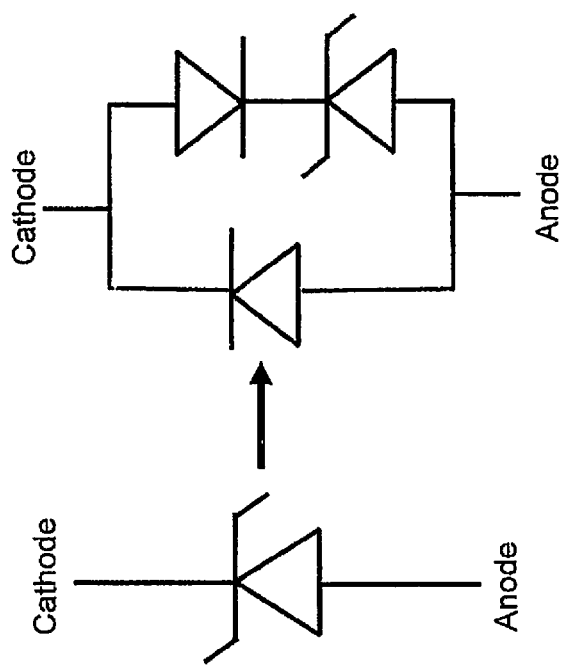

Refer to FIG. 2 for a side cross sectional view illustrated with equivalent circuit of a transient voltage suppressor (TVS) 100 of this invention. The TVS 100 is formed on a heavily doped P+ semiconductor substrate 105 which supports a P two-layer epitaxial layer 110 that includes a bottom P− epitaxial 110-1 and a top P− epitaxial layer 110-2 with a backside metal 101 disposed below the bottom surface to function as a ground terminal. The TVS 100 includes a P+ region high-side steering diode and Zener diode overlapping zone with a deep voltage breakdown (VBD) trigger implant layer 115 implanted with P+ dopant ions disposed between the bottom epitaxial layer 110-1 and a N+ buried layer 120 disposed below a top N+ source region 125. The Zener diode is formed from the buried layer 120 to the bottom epitaxial layer 110-1. A shallow P+ implant region 130 is formed near the top surface of the top P− epitaxial layer 110-2 to enhance the electrical contact with an I/O metal pad 135. An oxide insulation layer 145 covering the top surface has openings to allow a Vcc pad 140 to contact the N+ source regions 125 above the high-side diode and Zener diode overlapping zone and an I/O pad 135' contacting the source region 125' of the low side diode shown on the right side of the TVS 100, and for the I/O pad 135 to contact the shallow P+−implant region 130. The I/O pad 135 and the I/O pad 135' may be connected in the third dimension. The N+ source regions 125 has a gap in which the high-side diode is located from the top P-epitaxial layer 110-2 to the N+ buried layer 120. The low side diode is located from the source region 125' to the two-layer epitaxial layer 110. The TVS 100 further includes isolation trenches 150 to isolate the low-side steering diode with the high-side diode integrated with the overlapping Zener diode. A parasitic vertical PNP transistor is exists, from the shallow P+ implant region and the portions of the P-epitaxial region 110-2 below it, to the N+ buried layer 120, to N-epitaxial layer 110-1 below. By having a highly doped N+ buried layer 120, the transistor action is avoided. The parasitic vertical PNP transistor is part of a parasitic PNPN thysistor formed in the semiconductor regions between I/O metal pads 135 and 135'. A weaker PNP transistor will ensure that the parasitic thyristor does not turn on in applications that require the Vcc and Gnd terminals to be left floating. It is desired to not allow the steering diodes to breakdown, so the breakdown voltage of the Zener diode is made to be much lower than that of the steering diodes. The VBD trigger layer sets the breakdown voltage of the Zener diode at a desired low value.

Figures 1, 1A, 2, 3:
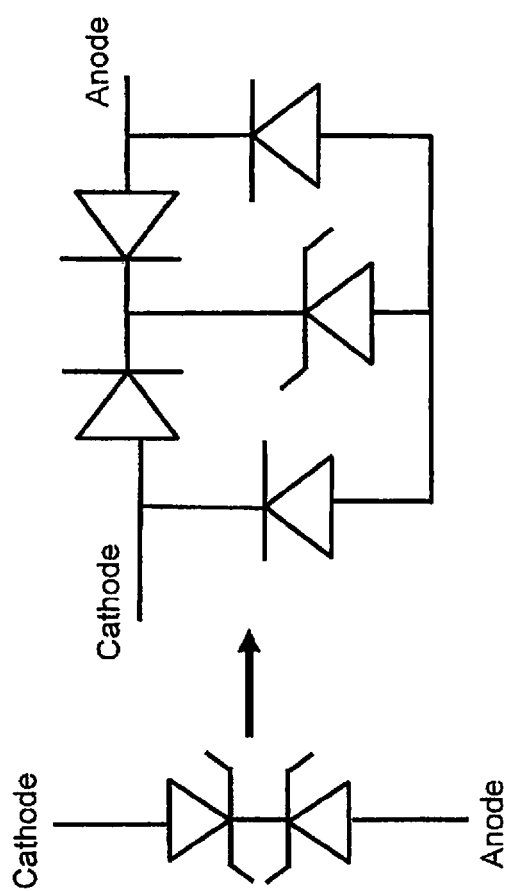
Figure 4:
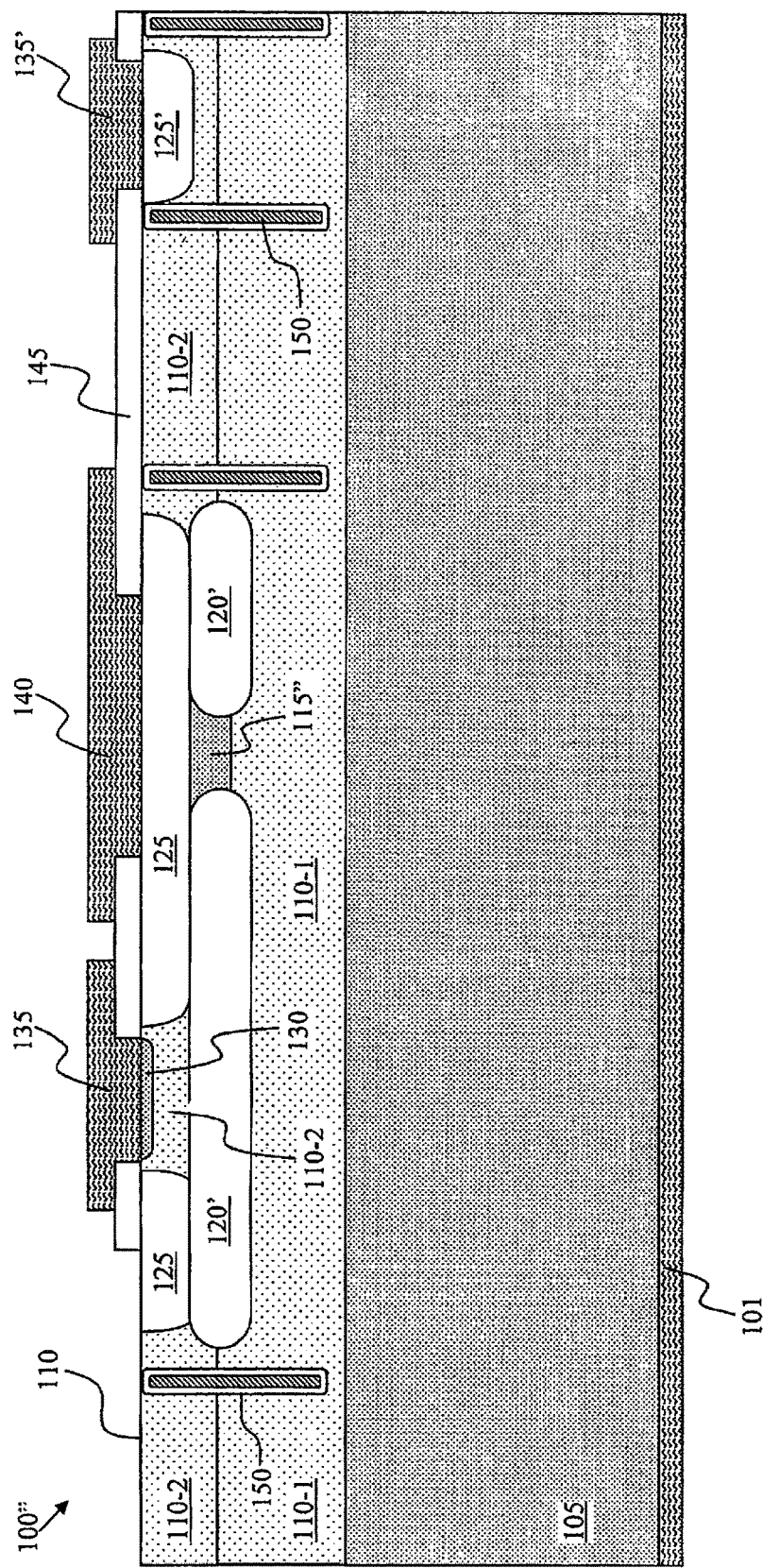

FIG. 3 is a cross sectional view for showing an alternate TVS 100' of this invention. The TVS 100' has a similar configuration as the TVS 100 shown in FIG. 2 except that the deep voltage breakdown (VBD) trigger layer 115' is formed with a patterned implant to form a gap under the high side steering diode in order to avoid a high doping layer directly under the high-side steering diode. This may avoid inadvertently raising the doping concentration of the portion of P-epitaxial layer 110-2 beneath the P+ implant region 130. This region should be kept at a low doping concentration to achieve low capacitance as explained below. FIG. 4 is a cross sectional view for showing another alternate TVS 100'' of this invention. The TVS 100'' has a similar configuration as the TVS 100 and 100' shown in FIGS. 2 and 3 respectively except that the N+ buried layer 120' is patterned with a gap in it and the deep voltage breakdown trigger layer 115'' is formed adjacent and in between instead of under the N+ buried layer 120'.

Figure 1B:
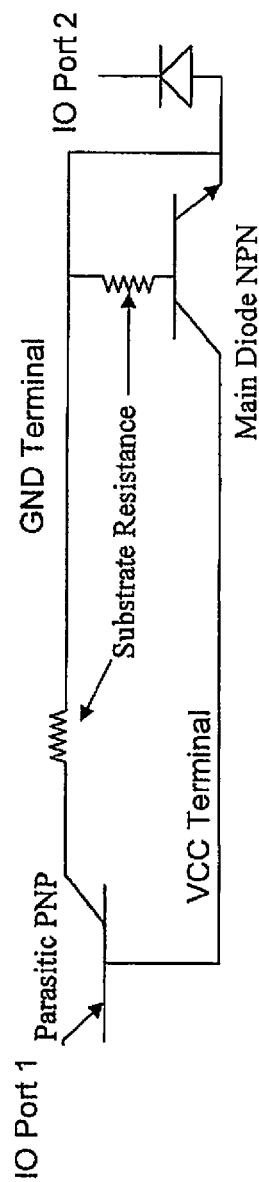
Figures 1, 1B:
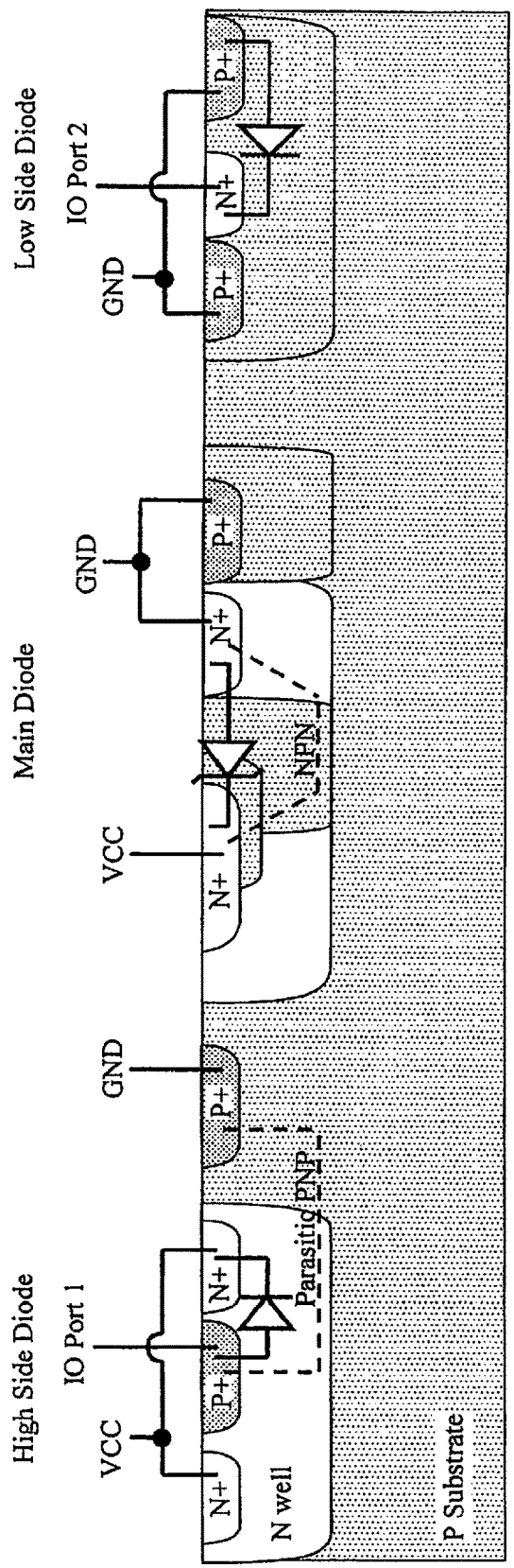
Figure 1C:
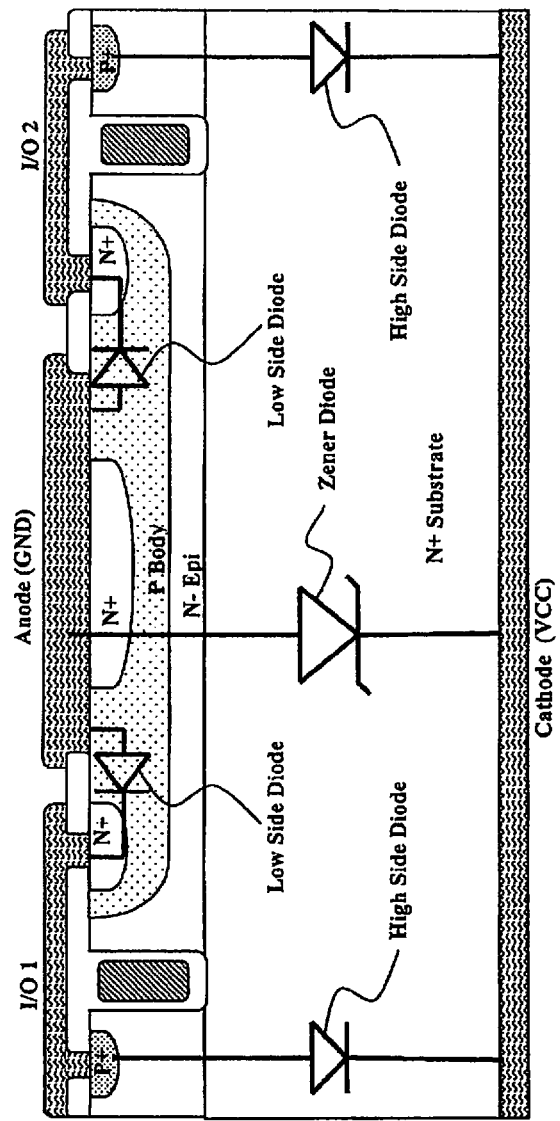
FIG. 1C shows a TVS circuit implemented with diodes formed as vertical diodes to reduce the size of the TVS circuit.
Figure 2:
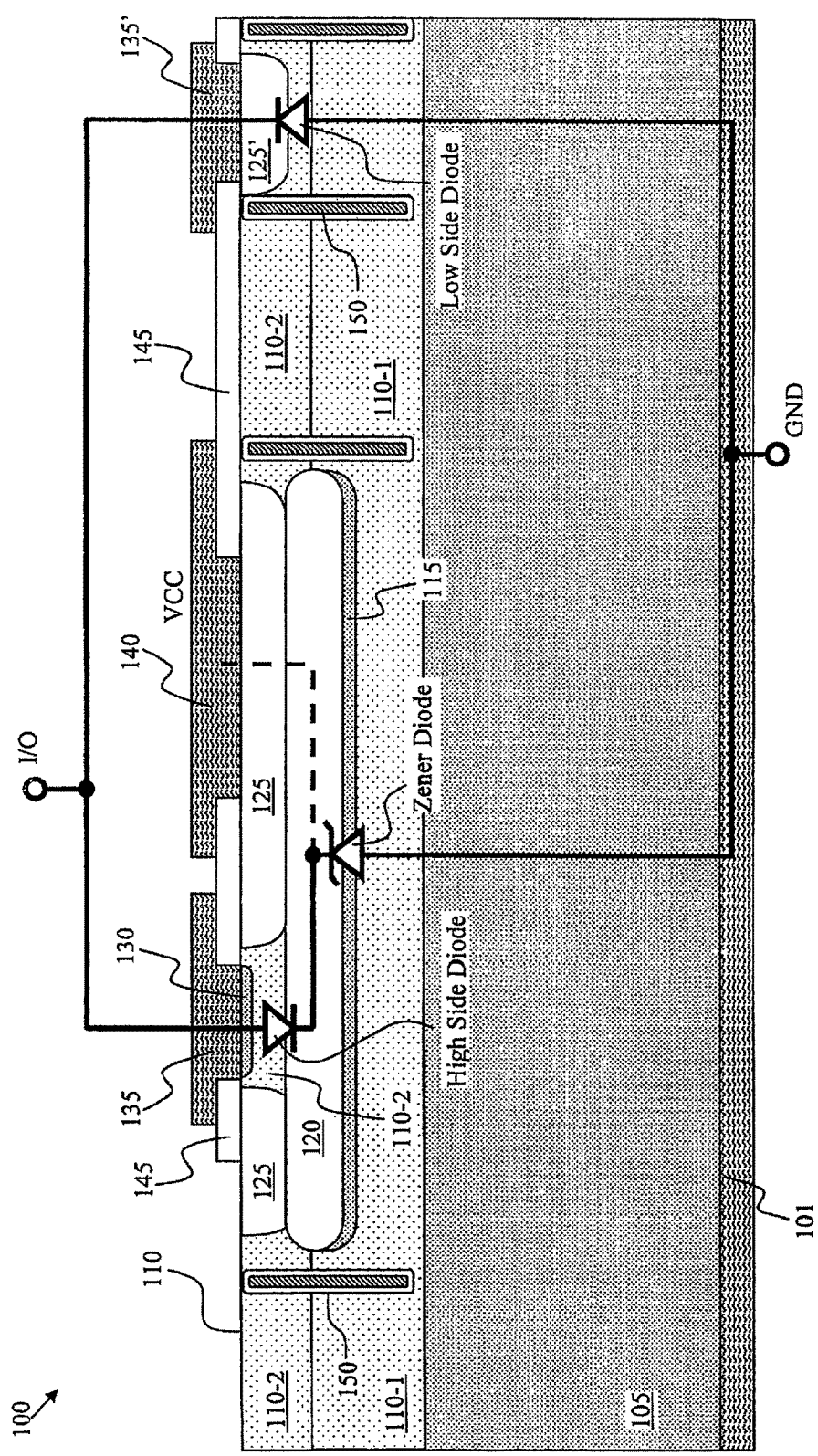
Figure 3:
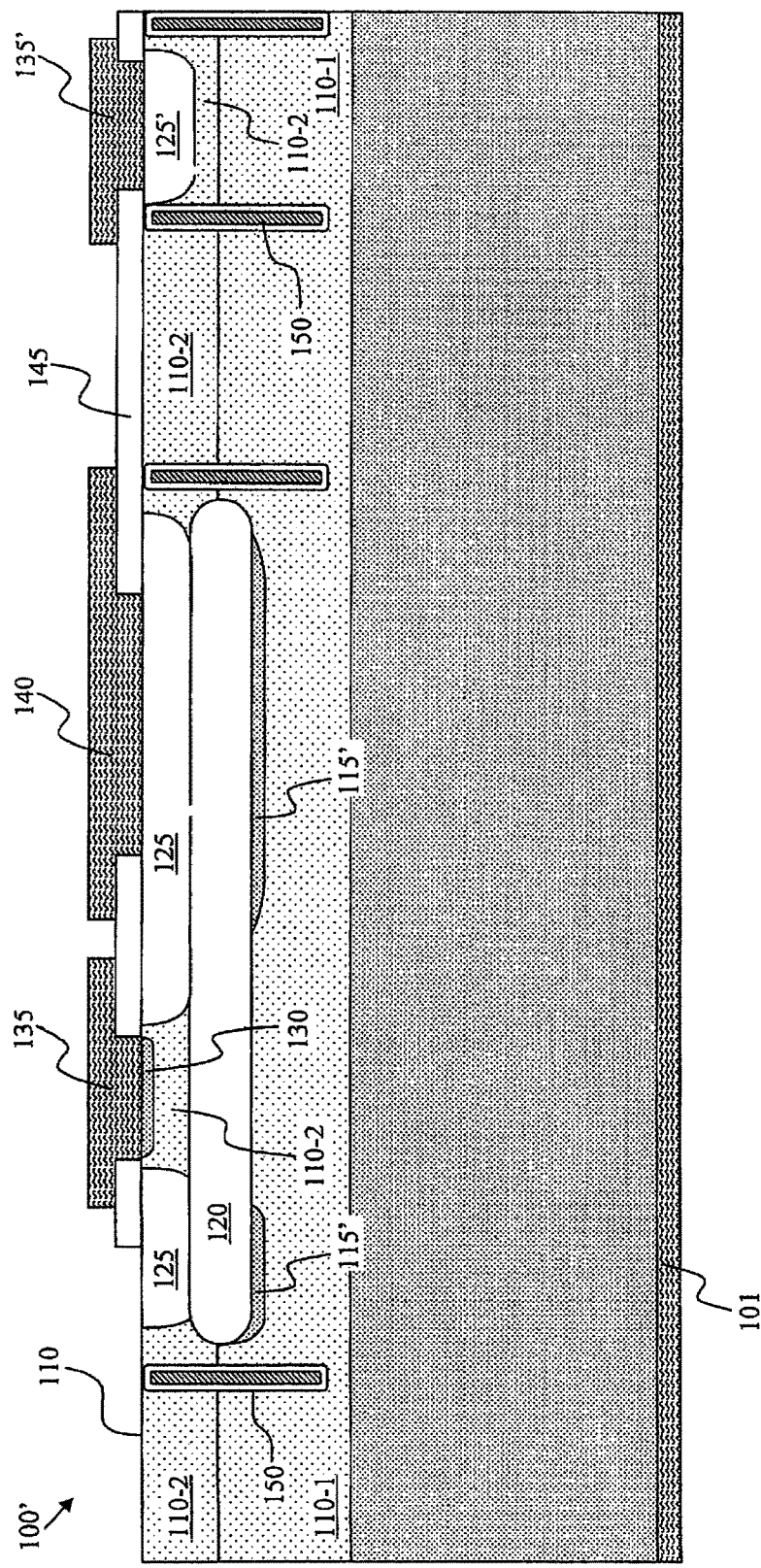
Figure 5A:
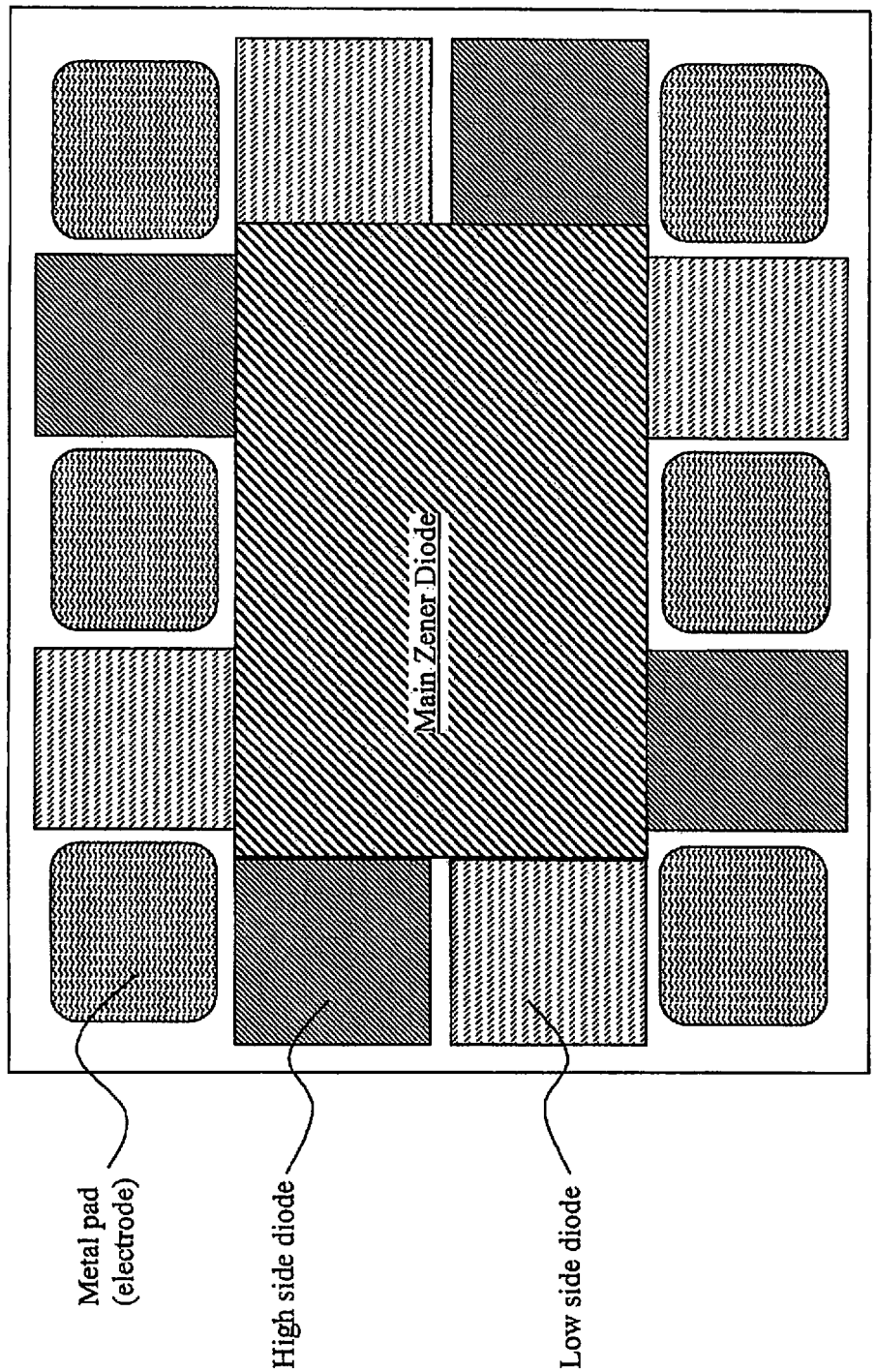
FIGS. 5A to 5B are top views of the layout of the TVS devices to show the reduced areas required by implementing the vertical diode array of this invention.
Figure 5B:
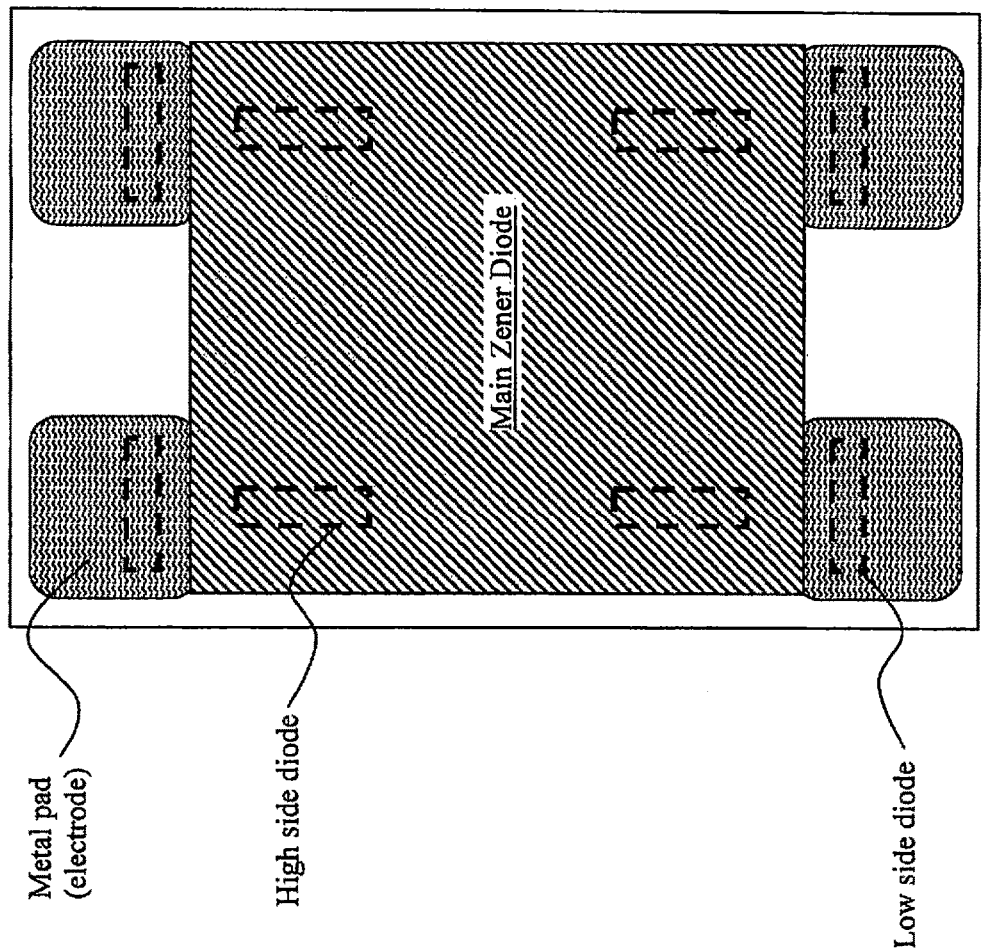

FIGS. 5A and 5B are top views for showing the layouts of a TVS according to a configuration shown in FIGS. 1B-1 and 2 respectively. As shown in FIG. 5A, the main Zener diode is formed on a separate area from the high side diode. In comparison, in FIG. 5B, the high side diode is overlapped with the Zener diode and therefore the TVS is formed with much reduced area compared with the TVS as that shown in FIG. 5A.

Figure 6:
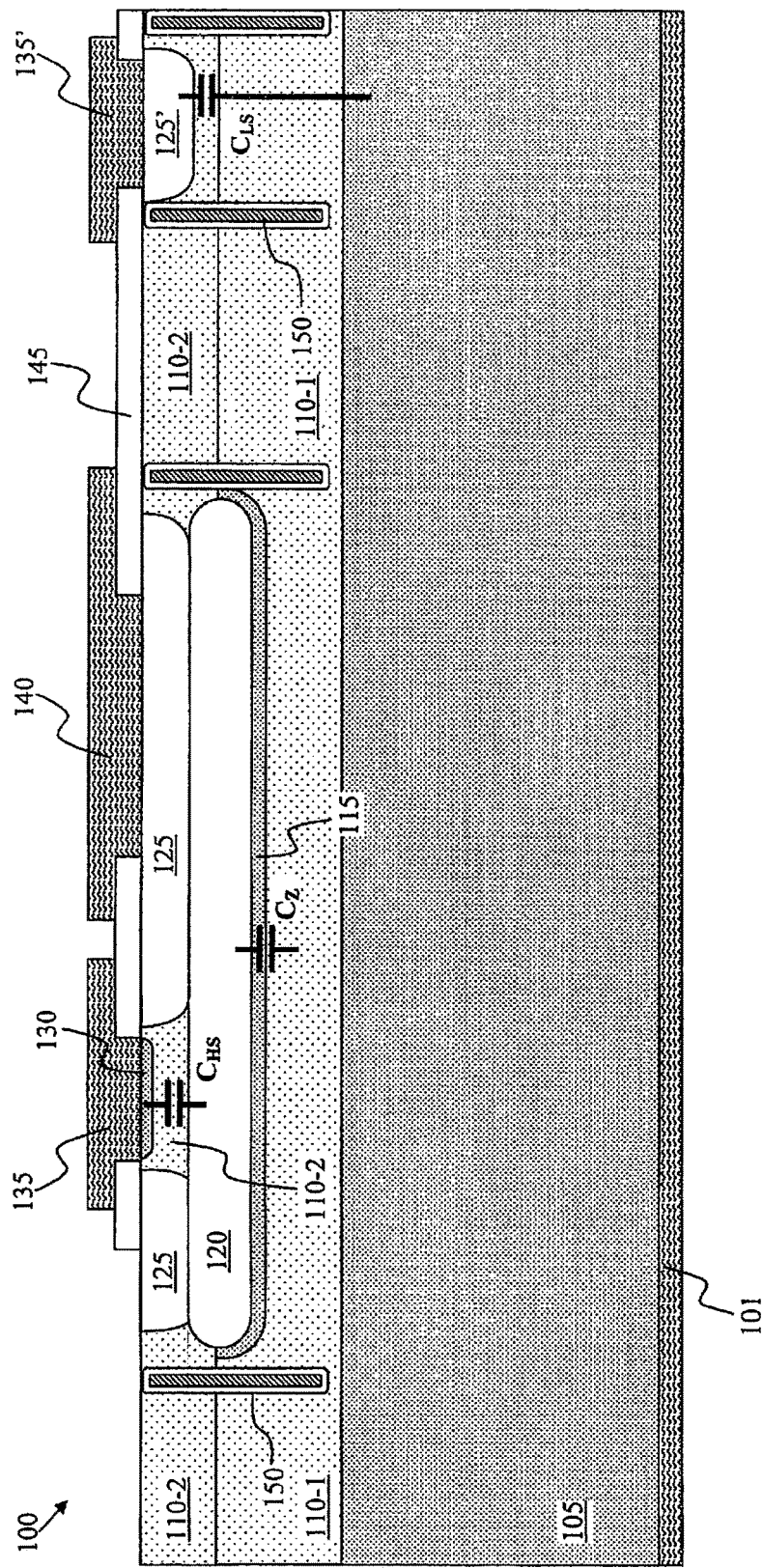
FIG. 6 is a cross sectional view for illustrating the capacitance components of a TVS circuit configured with N-buried layer (NBL) TVS Zener.
Figure 7:
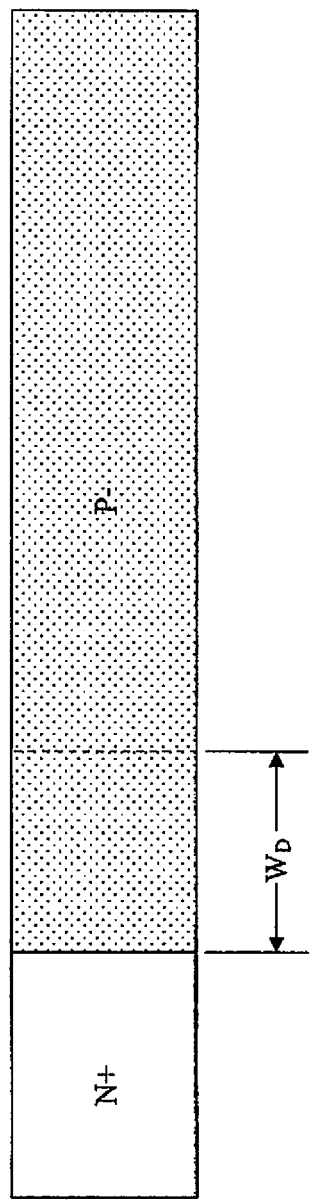
FIG. 7 is a diagram for illustrating the low capacitance designs for the steering diode as implemented for optimizing the design parameters in this invention.
Figure 8:
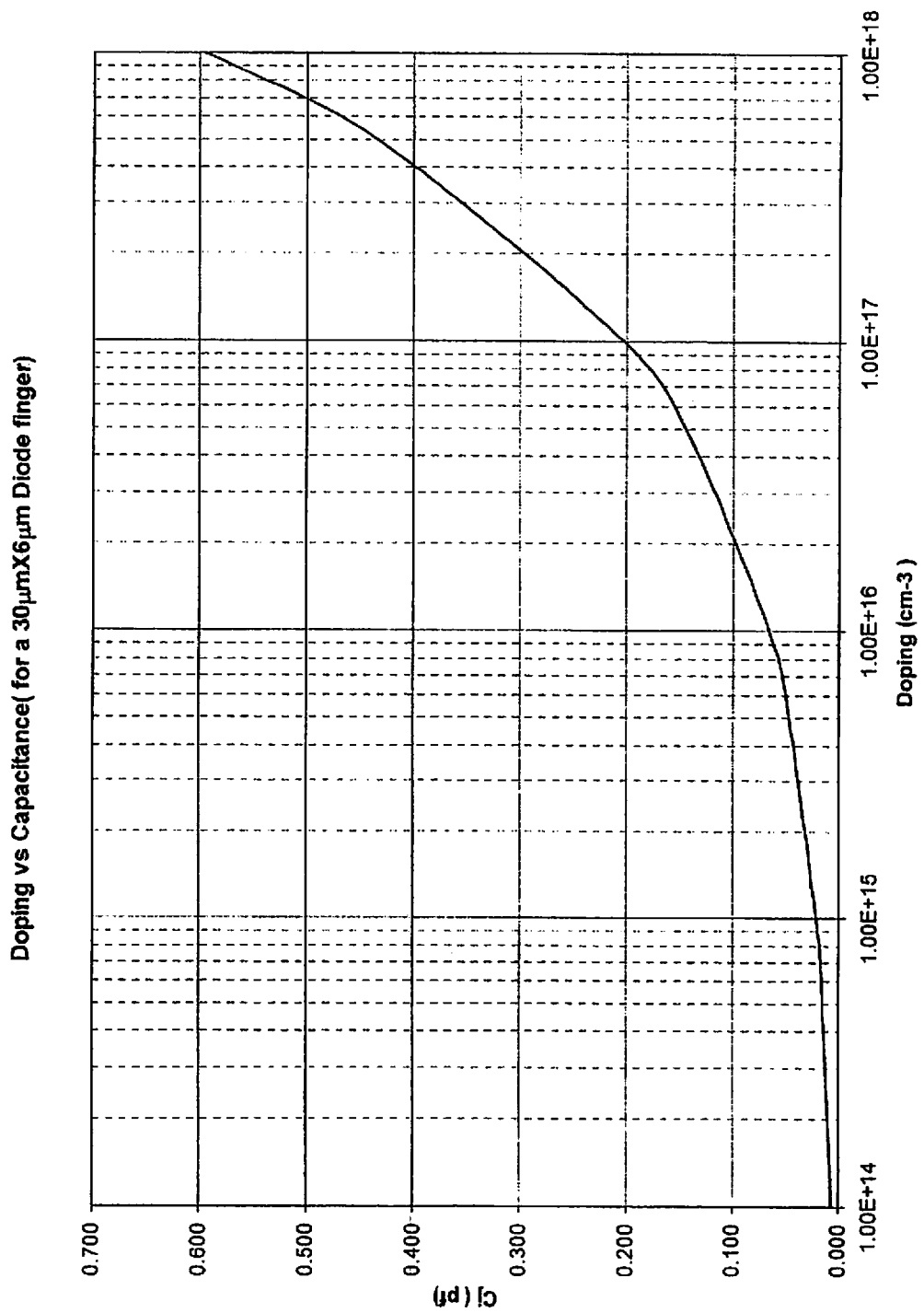
FIG. 8 is a diagram for showing the variation of the junction capacitance versus the doping concentration $N_D$ for an abrupt N+–P junction.
Figure 9:
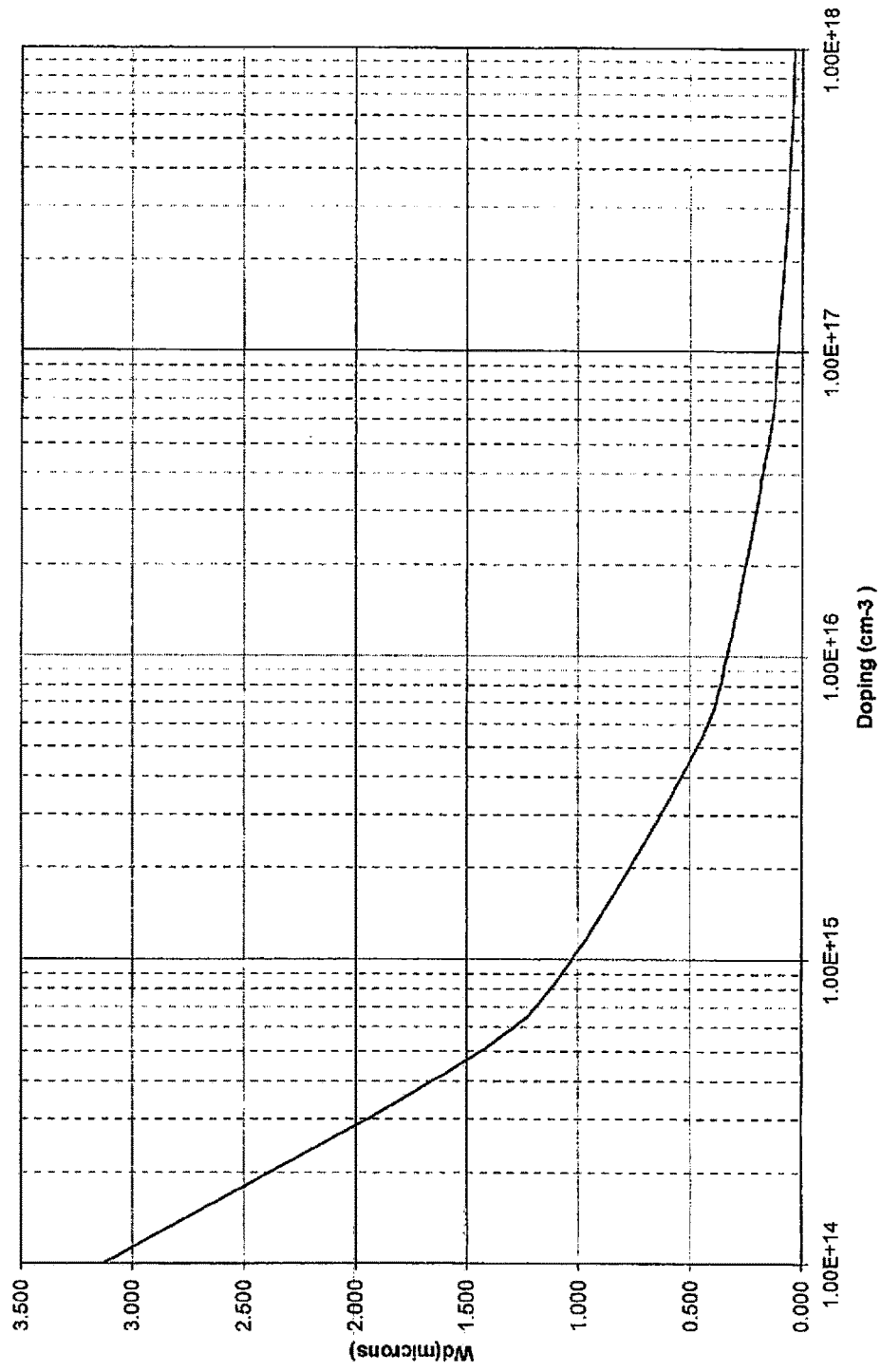
FIG. 9 is a diagram for showing the variation of the depletion width $W_D$ versus the doping concentration $N_D$ for an abrupt N+–P junction.

FIG. 6 is a cross sectional view shown with capacitance equivalent circuit to illustrate the total capacitance of the Zener diode $C_Z$ in combination with the high-side and the low-side diodes $C_{HS}$ and $C_{LS}$ respectively. Assuming that $C_Z$ is much greater than $C_{HS}$ or $C_{LS}$, the total capacitance $C_{Total}$ can be expressed as:

$$C_{Total} = \alpha_{PNP} * (C_{HS}) + C_{LS} + C_{(Pad)}$$

Where $\alpha_{PNP}$ is the emitter to collector gain of the vertical PNP transistor formed by P-epitaxial layer 110-2, N+ buried layer 120 and P− epitaxial layer 110-1, and C (Pad) is the pad capacitance. According to the above equation, it is necessary to reduce the capacitance of the high-side and low-side steering diodes $C_{HB}$ and $C_{LS}$ in order to achieve a low capacitance for the TVS; since $C_Z$ is much greater than and in series with $C_{HS}$, $C_Z$ has a negligible effect on CTotal. FIG. 7 illustrates the depletion width $W_D$ for an abrupt N+/P− junction. For a vertical diode the depletion width is in the vertical direction, so the depth of the P-layer should be at least as large as the depletion width $W_D$. However, the P-layer depth should not be much larger than $W_D$ or it will needlessly increase the forward resistance of the diode. For an abrupt N+ and P− junction, the junction capacitance Cj and breakdown voltage $V_{BD}$ are:

$$Cj \alpha (N_A)^{1/2}$$

$$V_{BD} \alpha (NA)^{-3/4} * (NPT)$$

Where $N_A$ represents the doping concentration of the P− region and NPT represents the Non-Punch Through breakdown voltage. The capacitance of the steering diodes decreases with a higher breakdown voltage when the dopant concentration is reduced as that shown in FIG. 8 for showing the junction capacitance Cj as a function of the dopant concentration and FIG. 9 for showing the depletion width $W_D$ in the epitaxial layer as function of the dopant concentration. FIG. 8 shows the junction capacitance Cj rising with the P dopant concentration. Therefore, optimal performance of the TVS is achievable by determining a lower epitaxial layer dopant concentration for the P-epitaxial layers 110-2 and then using that dopant concentration to determine an optimal thickness of the P-epitaxial layer 110-2 according to a width of the depletion layer thickness as shown in FIG. 9. For the high side diode, the capacitance is formed between the P+ implant region 130 and the NBL 120, so the vertical distance of the region of P-epitaxial layer 110-2 between P+ implant region 130 and N+ buried layer 120 should match the depletion width to achieve low capacitance. That vertical distance should be kept close to the depletion width to avoid needlessly increasing the forward resistance of the diode. For the low side diode, the vertical distance from source region 125' to substrate 105 should approximately match the depletion width (taking into account the doping concentrations of epitaxial layers 110-1 and 110-2). The thickness of the first epitaxial layer 110-1 should also take into account both the depletion width of the low side diode and also the distance from the high side diode; if the substrate 105 is too close to the high side diode, some of the dopants from the substrate 105 may diffuse into the region of the second epitaxial layer 110-2 under the contact implant 130 and increase the doping there and thus increase the capacitance of the high side diode. In a preferred embodiment, the dopant concentration of the P-epitaxial layers 110-1 and 110-2 will be as kept low as possible, to ensure a low capacitance in the steering diodes. The N+ buried layer 120 under the source region 125 is implanted with a highest dose with minimum diffusion by applying an automatic doping process while satisfying the breakdown voltage requirements of the vertical Zener diode.

Figure 10A:
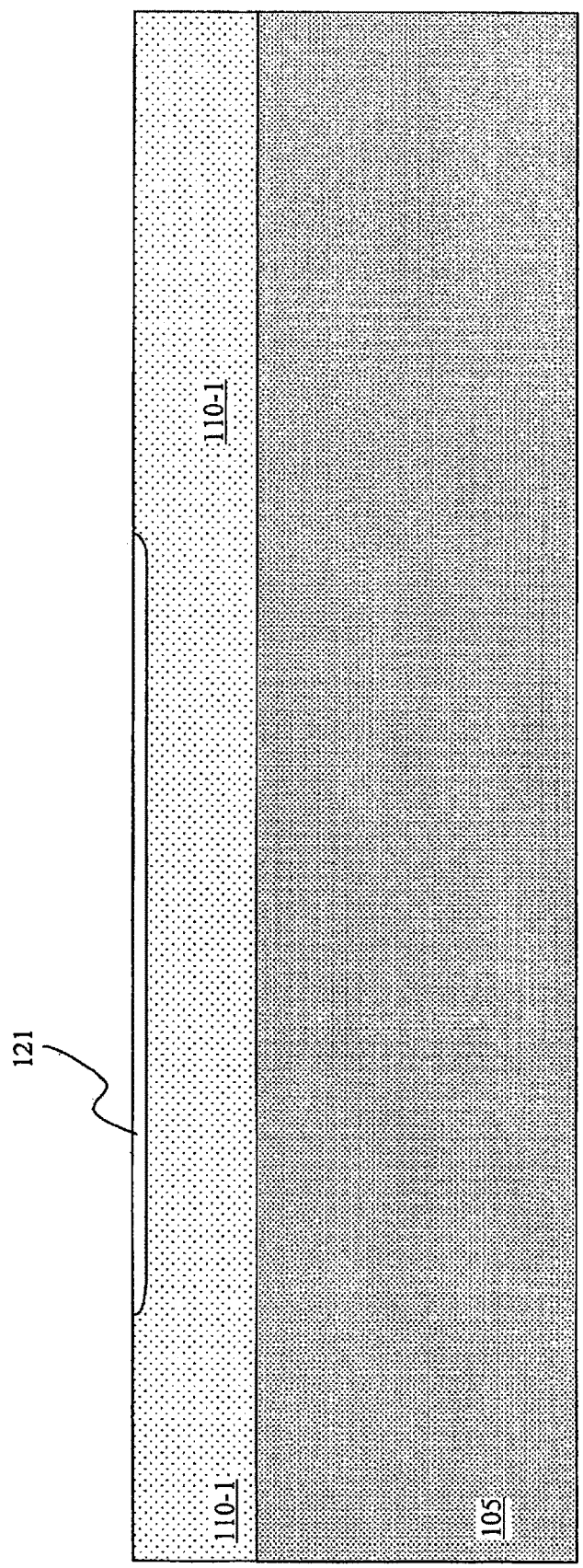
FIGS. 10A-10D are cross sectional views illustrating the forming of the NBL and the trigger implant layer.
Figure 10B:
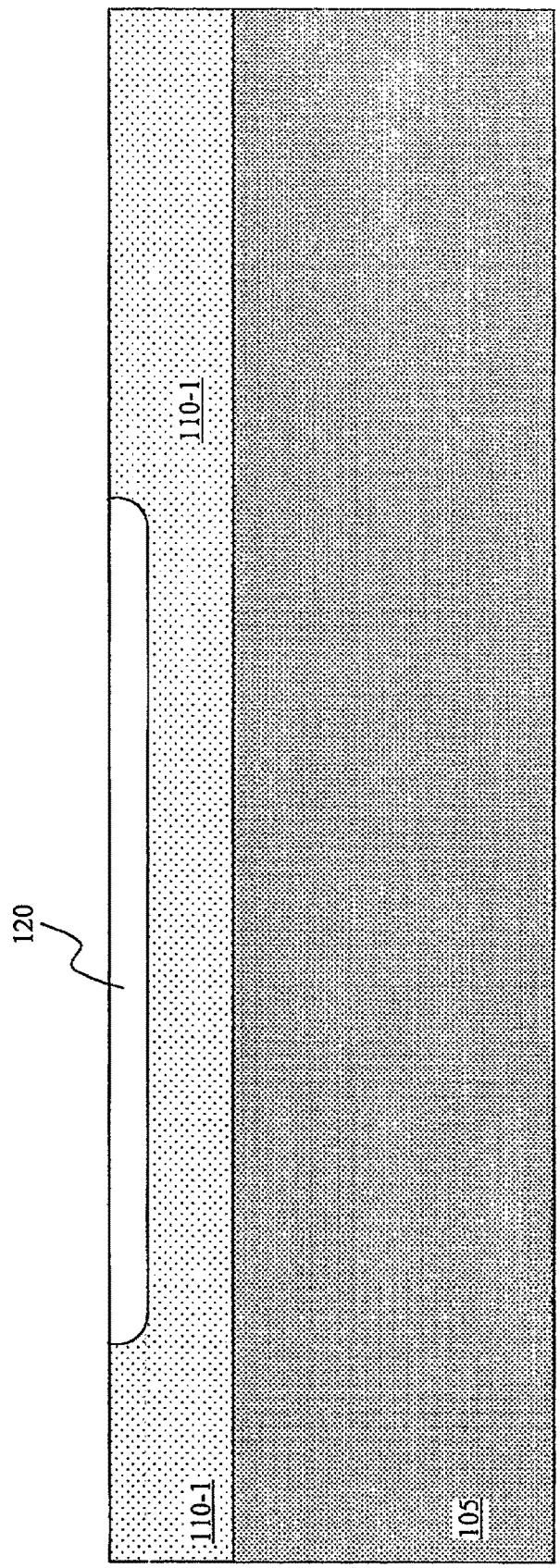
Figure 10C:
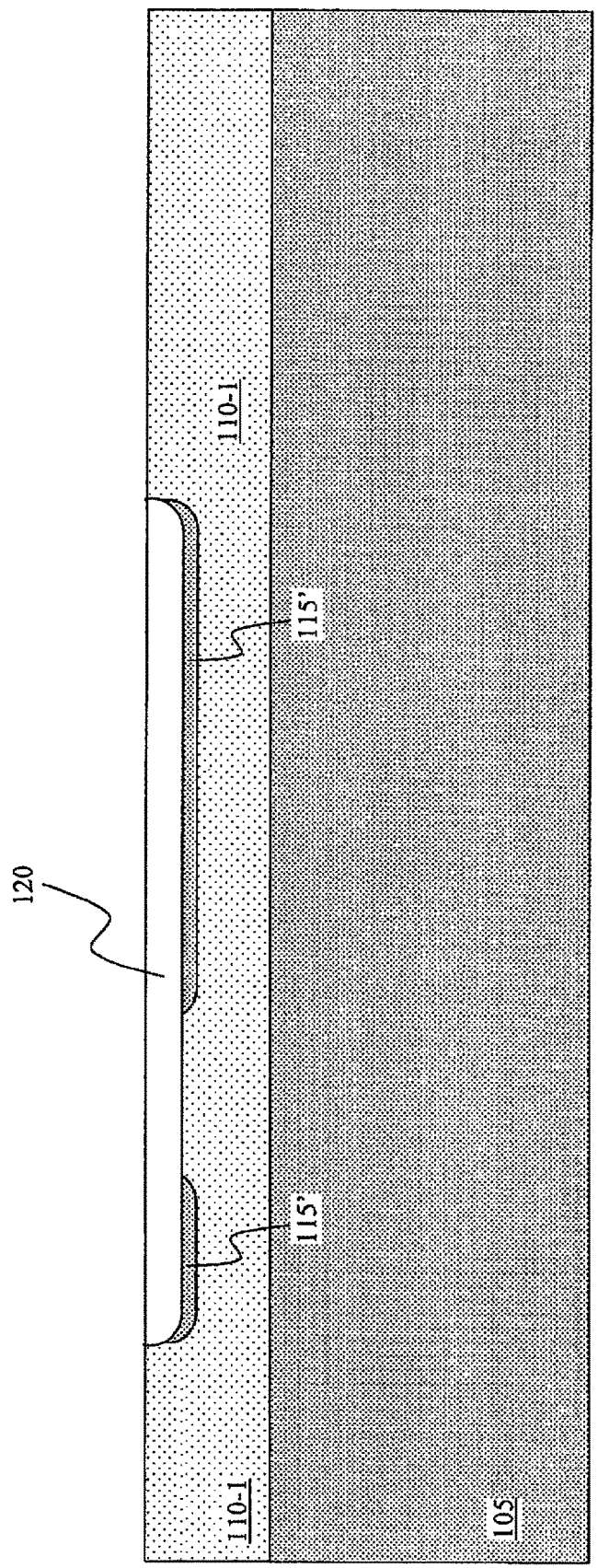
Figure 10D:
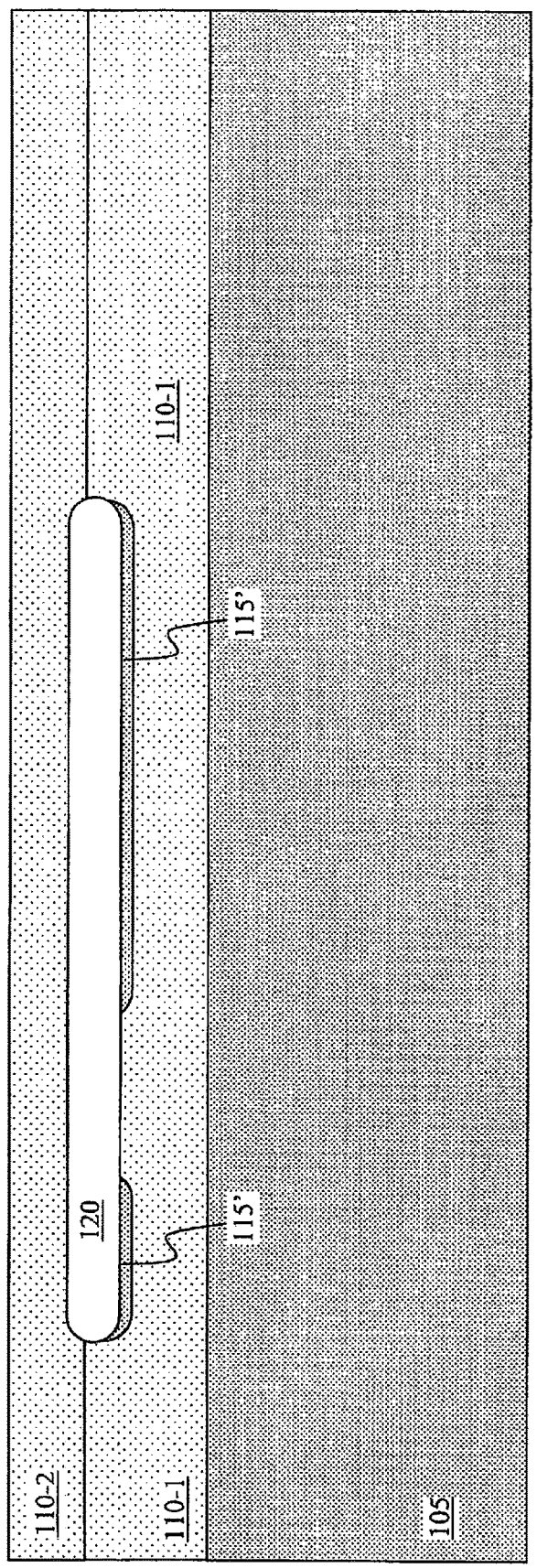

FIGS. 10A-D demonstrate a method for forming the NBL for a device similar to device 100' in FIG. 3. FIG. 10A shows a heavily doped P+ substrate 105 with a lightly doped first P-epi layer 110-1 grown over it. In FIG. 10B, a masked implant (mask not shown) is performed to form the N+ implant region 121. In FIG. 10C, a drive-in is performed to diffuse the N+ implant region 121 to form NBL 120. In FIG. 10C, another masked implant (mask not shown) is performed to form the P+ VBD trigger implant layer 115' underneath the NBL 120. In FIG. 10D, the second P-epi layer 110-2 is grown over the first P-epi layer 110-1. The NBL 120 may diffuse slightly into the second epitaxial layer 110-2.

Although the present invention has been described in terms of the presently preferred embodiment, it is to be understood that such disclosure is not to be interpreted as limiting. For example, the conductivity types of the semiconductor regions could be reversed so that the P-type regions are now N-type regions and vice versa. In this case the high side diode and the low side diode would swap positions; also the topside of semiconductor would have the lower voltage and the bottom side would have the higher voltage. Various alterations and modifications will no doubt become apparent to those skilled in the art after reading the above disclosure. Accordingly, it is intended that the appended claims be interpreted as covering all alterations and modifications as fall within the true spirit and scope of the invention.

I claim:

1. A transient voltage suppressing (TVS) device disposed on a semiconductor substrate comprising:
    a pair of steering diodes including a high side steering diode and a low side steering diode wherein the high side steering diode includes a PN junction disposed below a top surface of the semiconductor substrate in contact with a high side I/O pad that is connected to a low side I/O pad of the low side steering diode thus interconnecting the high side and low side steering diodes wherein the high side and low side steering diodes are further integrated with a main Zener diode for suppressing a transient voltage wherein the Zener diode constituting a PN junction as vertical diodes connected to a Vcc terminal through a top doped region under the top surface of the semiconductor substrate wherein the Zener diode is triggered for conducting a current along a vertical direction when an input voltage from the I/O pads is higher than a Vcc voltage; and
    the high side steering diode is overlapped with the Zener diode between two isolation trenches wherein the low side steering diode is disposed on an opposite side of one of the isolation trenches.

2. The transient voltage suppressing (TVS) device of claim 1 wherein:
    the high side steering diode further includes a P-epitaxial layer interfacing with a buried N dopant region and the Zener diode comprises the buried N-dopant region interfacing a deep buried body dopant region having a higher dopant concentration than the P-epitaxial layer.

3. The transient voltage suppressing (TVS) device of claim 1 wherein:
    the high side steering diodes further includes a lightly doped body dopant epitaxial layer disposed below the high side I/O pad and above a buried source dopant layer and the buried source dopant region is above a shallow body dopant region having a higher body dopant concentration than the lightly doped body region underneath that is functioning as part of the Zener diode and further for reducing a junction capacitance of the high side steering diodes.

4. The transient voltage suppressing (TVS) device of claim 1 wherein:
    the low side steering diodes comprises a lightly doped body dopant epitaxial layer disposed below the low side I/O pad and the lightly doped body dopant epitaxial layer is disposed above and interfaces a source region.

5. The transient voltage suppressing (TVS) device of claim 1 wherein:
    the semiconductor substrate further includes a bottom electrode disposed on a bottom surface of the semiconductor substrate for connecting to a ground voltage.

6. The transient voltage suppressing (TVS) device of claim 1 wherein:
    The isolation trenches extend vertically to a depth in the semiconductor substrate below the Zener diode.

7. The transient voltage suppressing (TVS) device of claim 1 wherein:
    a Vcc electrode disposed above the top doped region of the Zener diode and the Vcc electrode is insulated from the high side and low side I/O pad by a top insulation layer.

8. The transient voltage suppressing (TVS) device of claim 1 further comprising:
    the semiconductor substrate further includes a top P-type epitaxial layer and a buried N-type dopant region below the P-type epitaxial layer and the high side steering diode is a PN junction between the top P-type epitaxial layer and the N-type buried dopant region.

* * * * *